United States Patent
Min

(10) Patent No.: US 7,279,940 B1
(45) Date of Patent: Oct. 9, 2007

(54) SWITCHED-CAPACITOR CIRCUIT WITH TIME-SHIFTED SWITCHING SCHEME

(75) Inventor: Byung-Moo Min, Lexington, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 60 days.

(21) Appl. No.: 11/258,686

(22) Filed: Oct. 25, 2005

(51) Int. Cl.
*G11C 27/02* (2006.01)

(52) U.S. Cl. .................... 327/95; 327/96; 327/337

(58) Field of Classification Search ........... 327/91–96, 327/337, 554
See application file for complete search history.

(56) References Cited

U.S. PATENT DOCUMENTS

| | | | | |
|---|---|---|---|---|
| 4,988,900 | A * | 1/1991 | Fensch | 327/337 |
| 5,144,160 | A * | 9/1992 | Lee et al. | 327/96 |
| 5,410,270 | A * | 4/1995 | Rybicki et al. | 330/9 |
| 5,847,600 | A * | 12/1998 | Brooks et al. | 330/9 |
| 5,973,536 | A * | 10/1999 | Maejima | 327/337 |
| 6,011,433 | A * | 1/2000 | Nairn | 330/2 |
| 6,072,355 | A * | 6/2000 | Bledsoe | 327/390 |
| 6,169,427 | B1 * | 1/2001 | Brandt | 327/94 |
| 6,310,514 | B1 * | 10/2001 | Johnson | 330/2 |
| 6,636,084 | B2 * | 10/2003 | Sarraj | 327/95 |
| 6,661,283 | B1 * | 12/2003 | Lee | 330/9 |
| 6,683,514 | B2 * | 1/2004 | Fujimoto | 333/173 |
| 6,768,374 | B1 * | 7/2004 | Lee | 330/9 |
| 6,825,739 | B2 * | 11/2004 | Fujimoto | 333/173 |
| 2004/0130377 | A1 * | 7/2004 | Takeda et al. | 327/337 |
| 2004/0232948 | A1 * | 11/2004 | Rossi | 327/94 |

OTHER PUBLICATIONS

Dan Kelly et al., "A 3V 340mW 14b 75MSPS CMOS ADC with 85dB SFDR at Nyquist," Analog Devices Inc., 2001 IEEE International Solid State Circuits Conference, 3 pages.

* cited by examiner

*Primary Examiner*—Tuan T. Lam
*Assistant Examiner*—William Hernandez
(74) *Attorney, Agent, or Firm*—Patent Law Group LLP; Carmen C. Cook

(57) ABSTRACT

A switched-capacitor circuit for sampling a pair of differential input signals includes a first bootstrapped switch and a first non-boosted switch connected in parallel between a first output terminal of an amplifier and a first feedback node of the switched-capacitor circuit to form a first feedback signal path and a second bootstrapped-switch and a second non-boosted switch connected in parallel between a second output terminal of the amplifier and a second feedback node of the switched-capacitor circuit to form a second feedback signal path. The first and second non-boosted switches are controlled by a first clock signal and the first and second bootstrapped switches are controlled by a second clock signal where the second clock signal is the first clock signal delayed by a predetermined amount.

14 Claims, 4 Drawing Sheets

FLIP AROUND SHA    FIRST RESIDUE STAGE

SWITCHED-CAPACITOR CIRCUIT WITH TIME-SHIFTED SWITCHING SCHEME

FIELD OF THE INVENTION

The invention relates to switched-capacitor circuits and, in particular, to a switched-capacitor circuit implementing a time-shifted switching scheme to realize fast settling time.

DESCRIPTION OF THE RELATED ART

Electronics systems, such as communication or imaging system, often require a high-speed, high-resolution analog-to-digital converter (ADC) core that can be operated at low supply voltage and with low power consumption. One implementation of a high-speed, high-resolution ADC core uses a switched-capacitor pipeline ADC architecture and is described in D. Kelly et al., "A 3V 340 mW 14b 75MSPS CMOS ADC with 85 dB SFDR at Nyquist," IEEE International Solid-State Circuits Conference, 2001, Paper No. 8.5. In the switched-capacitor pipeline ADC of Kelly et al., a wide-band low-noise sample-and-hold amplifier (SHA) capable of high-speed sampling with low distortion is used to sample a pair of differential input signals.

FIG. 1(a) duplicates FIG. 8.5.3 of Kelly et al. and is a circuit diagram of a flip-around sample-and-hold amplifier (SHA) with the first residue stage of a switched-capacitor pipeline analog-to-digital converter (ADC). In the sample-and-hold amplifier circuit of FIG. 1(a), in order to achieve fast settling time in the feedback path of the switched-capacitor circuits, the switches in the SHA and the first residue stage of the ADC employ bootstrapping to improve harmonic distortion and eliminate the effects of signal dependent charge injection. Referring to FIG. 1(a), in addition to bootstrapping the SHA input switches, an additional bootstrap circuit is shared between the first residue stage input switches and the SHA feedback switches 4 and 5. The combined bootstrapping of the first residue stage input switches and the SHA feedback switches 4, 5 eliminates signal-dependent charge-injection errors, improves the first stage input acquisition settling time and reduces the load on the SHA.

However, the parasitic capacitance of all these bootstrap switches presents a considerable load on the bootstrap circuit. The bootstrap circuit therefore requires a large capacitor to reduce the attenuation of the boosted voltage due to charge sharing. To prevent the back-plate parasitic capacitance of the bootstrap circuit from loading the SHA, a high-speed buffer 2, 3 is inserted between the output terminal of the operational amplifier 1 and the bootstrap circuit, as shown in FIG. 1(a). FIG. 1(b) duplicates FIG. 8.5.4 of Kelly et al. and illustrates a circuit diagram of a buffered bootstrap circuit. The buffer provides an extra large driving capability for driving the large back-plate parasitic capacitance (Cboost) of the bootstrap circuit.

In the conventional ADC circuit shown in FIGS. 1(a) and 1(b), the feedback path around the operational amplifier 1 is not activated until the buffer 2 or 3 is fully activated and the bootstrapped NMOS switch 4 or 5 is turned on. When the feedback path is not activated, the SHA experiences longer settling time. Therefore, the conventional ADC circuit utilizing bootstrap switches not only consumes more power, but also is not fast enough for high-end switched-capacitor circuit applications.

SUMMARY OF THE INVENTION

According to one embodiment of the present invention, a switched-capacitor circuit for sampling a pair of differential input signals is disclosed. The switched-capacitor circuit includes a pair of sampling capacitors coupled to sample the differential input signals based on a first clock signal and transfer charge associated with the sampled differential input signals to respective first and second input terminals of an amplifier. The switched-capacitor circuit further includes a first bootstrapped switch and a first non-boosted switch connected in parallel between a first output terminal of the amplifier and a first feedback node of the switched-capacitor circuit to form a first feedback signal path and a second bootstrapped switch and a second non-boosted switch connected in parallel between a second output terminal of the amplifier and a second feedback node of the switched-capacitor circuit to form a second feedback signal path.

The first non-boosted switch is controlled by a second clock signal and the first bootstrapped switch is controlled by a third clock signal where the first and second clock signals are non-overlapping clock signals and the third clock signal is the second clock signal delayed by a predetermined amount. The second non-boosted switch is controlled by the second clock signal and the second bootstrapped switch is controlled the third clock signal.

The present invention is better understood upon consideration of the detailed description below and the accompanying drawings.

DETAILED DESCRIPTION OF THE PREFERRED EMBODIMENTS

In accordance with the principles of the present invention, a switched-capacitor circuit implements a time-shifted switching scheme in the closed loop feedback signal path to achieve high linearity and fast settling time in operation. Specifically, the switched-capacitor circuit includes a parallel connection of a bootstrapped switch and a non-boosted switch as the feedback switch in the feedback signal path.

The bootstrapped switch and the non-boosted switch are operated under a time-delayed clocking scheme where the bootstrapped switch is enabled a short delay time after the non-boosted switch. In this manner, the amplifier in the switched-capacitor circuit can effectively drive the non-boosted switch to activate the feedback signal path quickly so that the amplifier can perform the large signal operation and the amplifier then has sufficient large signal drive capability to drive the bootstrapped switch when the bootstrapped switch is subsequently turned on. In this manner, the switched-capacitor circuit can achieve fast settling time in operation.

In one embodiment, the non-boosted switch is implemented as a single NMOS transistor, a single PMOS transistor, or a transmission gate. The non-boosted switch is enabled first and then the bootstrapped switch is enabled a few hundreds of pico-second or a nano-second afterwards. The exact amount of time delay to turn on the bootstrapped switch is a matter of design choice and is selected to achieve higher linearity and faster settling time.

In another embodiment, the switched-capacitor circuit is applied to form a high speed sample-and-hold amplifier (SHA) for a switched-capacitor pipeline analog-to-digital converter (ADC) to achieve fast-settling time for the SHA. It is understood that a sample-and-hold amplifier is a switched-capacitor circuit with a gain of 1. In the following description, the term "sample-and-hold amplifier" will be used sometimes to refer to the switched-capacitor circuit of the present invention. It is understood that the switched-capacitor circuit of the present invention can be implemented with a gain of 1 or more and that references to a SHA are merely exemplary embodiments of the switched-capacitor circuit of the present invention.

Figure 2:
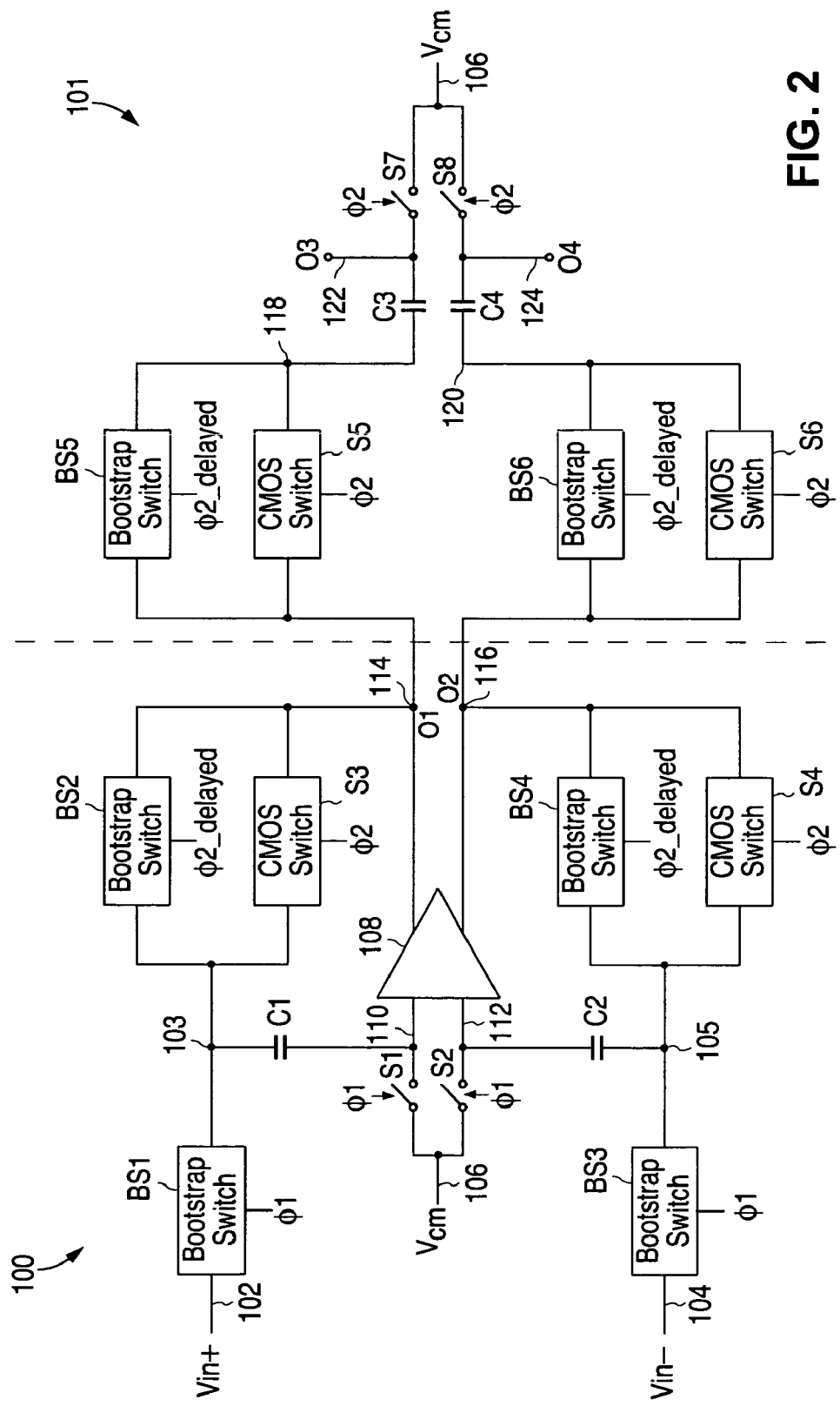
FIG. 2 is a circuit diagram of a flip-around type SHA employing a parallel connection of a bootstrapped switch and a non-boosted CMOS switch and operated under a time-shifted switching scheme according to one embodiment of the present invention.

FIG. 2 is a circuit diagram of a flip-around type sample-and-hold (SHA) employing a parallel connection of a bootstrapped switch and a non-boosted CMOS switch and operated under a time-shifted switching scheme according to one embodiment of the present invention. Referring to FIG. 2, a sample-and-hold (SHA) 100 includes a pair of bootstrapped switches BS1 and BS3 coupled to receive the differential input signals Vin+ and Vin− on input nodes 102 and 104. Switches BS1 and BS3, under the control of a clock signal φ1, sample the differential input signals onto a pair of capacitors C1 and C2 coupled to the input terminals 110, 112, respectively, of an operational amplifier 108. A pair of switches S1 and S2, under the control of a clock signal φ1, are coupled to connect the input terminals 110, 112 of operation amplifier 108 to the common mode voltage Vcm (node 106) when the input signals are not being sampled. Operational amplifier 108 generates differential output signals O1 and O2 on output terminals 114 and 116 respectively. The input stage configuration and operation of SHA 100 is conventional. Clock signals φ1 and φ2 are non-overlapping clock signals 180 degrees out of phase. Thus, clock φ1 is active while clock φ2 is not and vice versa.

When clock φ1 is active denoting the sampling phase, switches BS1 and BS3 and switches S1 and S2 are closed to sample the differential input voltage onto capacitors C1 and C2. Capacitor C1 is thus charged up to the input voltage Vin+ relative to the common mode voltage Vcm and capacitor C2 is charged up to the input voltage Vin− relative to the common mode voltage Vcm.

In accordance with the present invention, SHA 100 includes a parallel connection of a bootstrapped switch and a non-boosted switch in the feedback signal path. Specifically, a bootstrapped switch BS2 and a non-boosted CMOS switch S3 are connected in parallel between first output terminal 114 of operational amplifier 108 and the top plate (node 103) of capacitor C1 to form the first feedback signal path for the differential output signal O1. A bootstrapped switch BS4 and a non-boosted switch S4 are connected in parallel between second output terminal 116 of operational amplifier 108 and the top plate (node 105) of capacitor C2 to form the second feedback signal path for the differential output signal O2.

In the first and second feedback signal paths, the non-boosted switches S3 and S4 are controlled by clock signal φ2 while bootstrapped switches BS2 and BS4 are controlled by a clock signal φ2_delayed which is a delayed version of the clock signal φ2. That is, clock signal φ2_delayed is clock signal φ2 delayed by a predetermined amount. Accordingly, whenever the clock signal φ2 enters its active phase, non-boosted switches S3 and S4 are turned on first to activate the feedback loop of SHA 100 and then bootstrapped switch BS2 and BS4 are subsequently turned on after the delay provided by clock signal φ2_delayed.

Thus, by implementing the time-shifted switching scheme in accordance with the present invention, when SHA 100 enters the amplification phase controlled by clock signal φ2, the close loop feedback signal path is activated by the non-boosted switches S3 and S4 to allow the switched-capacitor network to perform its large signal operation such as op-amp slewing (slew-rate limited operation). After the predetermined delay time provided by clock signal φ2_delay, the bootstrapped switches BS2 and BS4 are enabled to form parallel feedback signal paths with the non-boosted switches S3 and S4.

When the bootstrapped switches BS2 and BS4 are enabled together with the non-boosted switches S3 and S4 to drive the feedback loop, the parasitic capacitance of the bootstrapped switches BS2 and BS4 are driven by the output signals of the slewing operational amplifier 108 and the switched-capacitor network enters its time-constant limited operation. Because operation amplifier 108 has already begun its output slewing operation, operation amplifier 108 can provide a large signal to drive the large capacitance of the bootstrapped switches BS2 and BS4 and no additional drive or buffering circuit is required to drive the large backside capacitance of the bootstrapped switches. Through the enhanced conductivity in the feedback loop provided by the bootstrapped switches BS2 and BS4, the switched-capacitor circuit of SHA 100 starts the linear settling operation.

At the end of the amplification phase, clock φ2 is disabled first before clock φ2_delay. When clock φ2 is disabled, the non-boosted CMOS switches S3 and S4 generate a small amount of signal-dependent charge injection or charge-feedthrough. However, at this time, since the clock φ2_delayed is still enabled, the error terms attributed by the turning off of the non-boosted switches do not affect the sampled-signals (O1 and O2) of the next stage. In this manner, the time-shifted switching scheme of the present invention provides high linearity.

By using the time-shifted switching scheme in accordance with the present invention, the operational amplifier of the SHA is capable of driving the large parasitic capacitance of the bootstrapped switches without extra buffer circuits. This is because the operational amplifier is able to start its slew-rate limited operation before the large parasitic capacitance of the bootstrapped switches is introduced in the feedback signal path. By eliminating buffering circuits that are commonly used in the conventional switched-capacitor circuits to drive the bootstrapped switches, power consumption of the SHA is reduced while fast settling time is achieved.

Figure 1A:
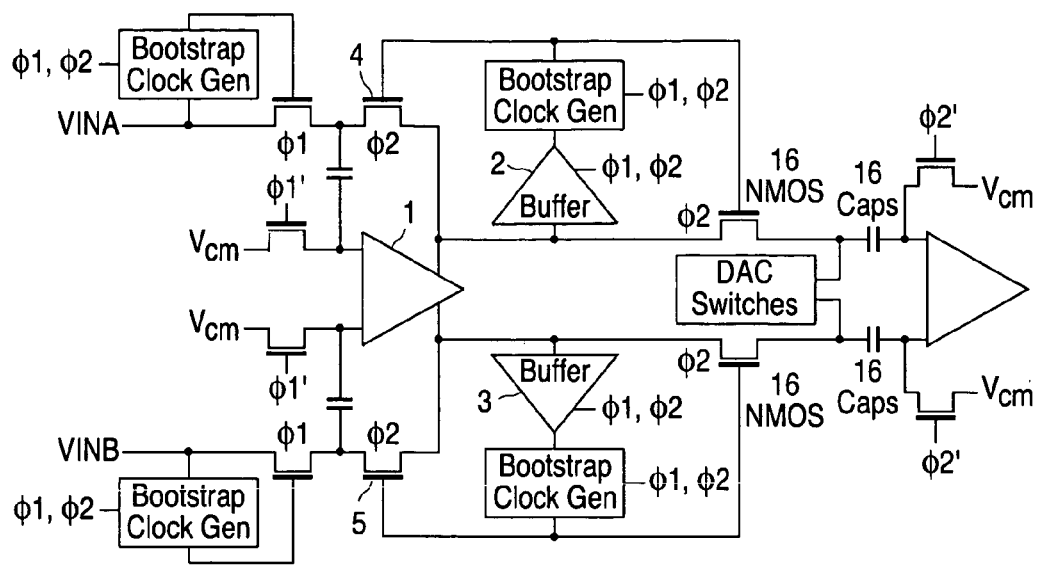
FIG. 1(a) duplicates FIG. 8.5.3 of Kelly et al. and is a circuit diagram of a flip-around SHA with the first residue stage of a switched-capacitor pipeline ADC.
Figure 1B:
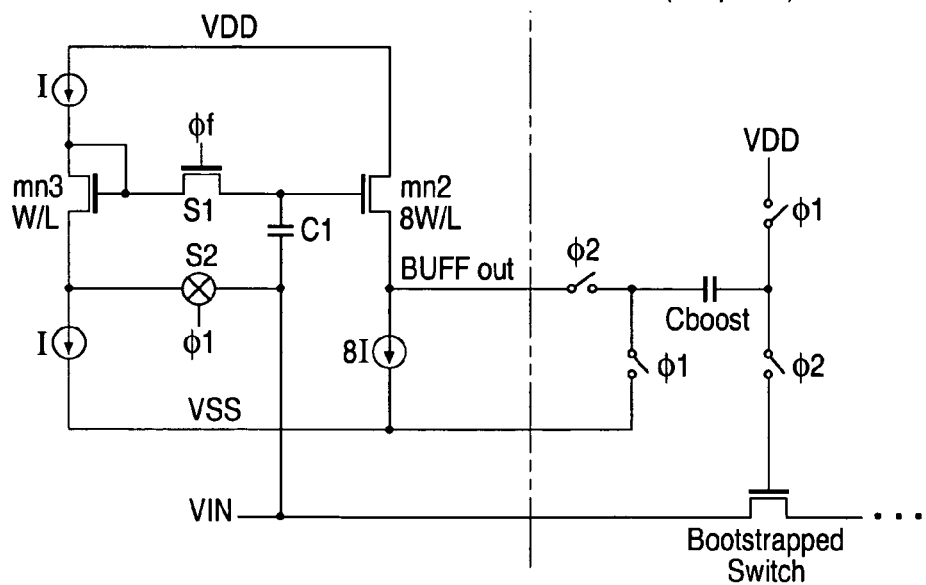
FIG. 1(b) duplicates FIG. 8.5.4 of Kelly et al. and illustrates a circuit diagram of a buffered bootstrap switch.

Furthermore, in the conventional SHA circuits such as that shown in FIG. 1(a), when the amplification phase is initiated, the feedback path including the bootstrapped switches is not activated until the operational amplifier has reached a large signal state to drive the buffers. The convention SHA circuits thus suffer from long settling time and are not suitable for high speed applications. By using the time-shifted switching scheme of the present invention, the feedback signal path is activated when the amplification phase is initiated. The switched-capacitor circuit or sample-and-hold amplifier thus form is capable of achieving fast settling time, consume less power, and can be readily applied in high speed applications such as analog-to-digital converters.

In the circuit diagram of FIG. 2, SHA 100 is shown coupled to a loading stage 101 including sampling capacitors C3 and C4 for sampling the differential output signals O1 and O2 and providing differential output signals O3 and O4 on nodes 122 and 124 respectively. The differential output signals O3 and O4 of loading stage 101 can be coupled to circuitry such as a multiplication digital-to-analog converter (MDAC) in a pipelined-ADC. Sampling capacitors C3 and C4 are switchably connected to differential output signals O1 and O2 on nodes 114 and 116. The stability of operational amplifier 108 is enhanced by the capacitive loading provided by capacitors C3 and C4 during the slew-rate limited operation defined by clock signal $\phi2$.

In the conventional SHA circuits such as that shown in FIG. 1(a), sampling capacitors C3 and C4 in the loading stage 101 are typically connected to output terminals of the operational amplifiers through a pair of bootstrapped switches. In general, the sampling capacitors C3 and C4 in the loading stage of a SHA are switchably connected to the output terminals of the operation amplifier of the SHA through non-boosted switches or through bootstrapped switches, as shown in FIG. 1(a). In accordance with one aspect of the present invention, each of sampling capacitors C3 and C4 in the loading stage 101 coupled to SHA 100 is switchably connected to a respective output terminal 114, 116 of operational amplifier 108 through a pair of parallely connected bootstrapped and non-boosted switches.

Specifically, in the present embodiment, a bootstrapped switch BS5 and a non-boosted CMOS switch S5 are connected in parallel between first output terminal 114 of operational amplifier 108 and the top plate (node 118) of capacitor C3. A bootstrapped switch BS6 and a non-boosted switch S6 are connected in parallel between second output terminal 116 of operational amplifier 108 and the top plate (node 120) of capacitor C4. A pair of switches S7 and S8, under the control of a clock signal $\phi2$, is coupled to connect the bottom plates (nodes 122, 124) of capacitors C3, C4 to the common mode voltage Vcm (node 106) when the input signals are not being sampled.

The time-shifted switching scheme of the present invention is applied to drive the bootstrapped switches and the non-boosted switches so that the bootstrapped switches are enabled a given delay after the non-boosted switches are enabled. Specifically, the non-boosted switches S5 and S6 are controlled by clock signal $\phi2$ while bootstrapped switches BS5 and BS6 are controlled by clock signal $\phi2\_delayed$ which is a delayed version of the clock signal $\phi2$. Accordingly, whenever the clock signal $\phi2$ enters its active phase, non-boosted switches S5 and S6 are turned on first to connect the output signals O1 and O2 of SHA 100 to sampling capacitor C3 and C4 and then bootstrapped switch BS5 and BS6 are subsequently turned on after the delay provided by clock signal $\phi2\_delayed$ to increase the conductivity through the signal paths.

The use of the parallel connection of a bootstrapped switch and a non-boosted switch for coupling the sampling capacitors in the loading stage to the SHA as shown in FIG. 2 is illustrative only. It is understood that the switches coupling the loading stage to a SHA can be implemented using non-boosted switches or bootstrapped switches as in conventional practices. However, the use of a parallel connection of a bootstrapped switch and a non-boosted switch in accordance with the present invention provides added advantages.

By applying the parallel connection of a bootstrapped switch and a boosted switch for the sampling switches in the loading stage 101 and controlling the sampling switches using the time-shifted switching scheme in accordance with the present invention, the activation of the bootstrapped switches in the loading stage can be delayed so that loading on operational amplifier 108 is reduced while operation amplifier 108 starts output slewing. Furthermore, the non-boosted switches are turned off while the bootstrapped switches are still on so that charge injection errors introduced by the turning off the non-boosted switches are minimized.

Figure 5:
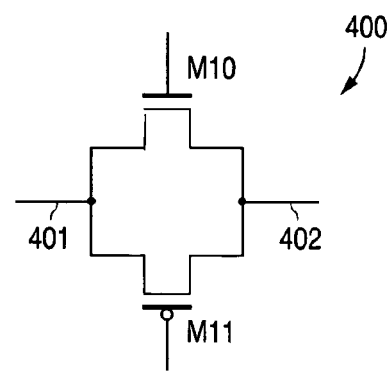
FIG. 5 is a circuit diagram of a CMOS switch circuit or a CMOS transmission gate which can be used to implement the non-boosted switches in the time-shifted switching scheme according to one embodiment of the present invention.

In the present embodiment of the present invention, the non-boosted switches S3, S4, S5 and S6 in SHA 100 and loading stage 101 are implemented as CMOS switches. That is, each of the non-boosted switches is implemented as a parallel connection of a PMOS transistor and an NMOS transistor as shown in FIG. 5. When the CMOS switch 400, also referred to as a CMOS transmission gate, of FIG. 5 is used, the parallel connection of NMOS transistor M10 and PMOS transistor M11 ensures a full voltage swing at both the input and output terminals (nodes 401, 402) of the CMOS switch. A CMOS switch has the advantage of providing lower on-resistance. However, the CMOS switch requires larger silicon area to implement.

In other embodiments of the present invention, each of the non-boosted switches can be implemented using a single PMOS or NMOS transistor. While a single PMOS or NMOS transistor has higher on-resistance than a CMOS switch, a single-transistor switch requires less silicon space to implement. Furthermore, when the time-shifted switching scheme is applied to control the parallel connection of the bootstrapped switch and the single-transistor non-boosted switch, the non-boosted switch with smaller parasitic capacitance is turned on first by the operation amplifier and then the large capacitance bootstrapped switch is turned on to achieve a fast settling time. Therefore, when implemented in accordance with the present invention, a low on-resistance non-boosted switch is not critical to the operation of the SHA, allowing single-transistor switches to be used without adverse effect. In fact, single-transistor switches have the added advantages of reducing the effects of signal dependent charge injection.

In one embodiment, the clock delay for use in the time-shifted switching scheme of the present invention is implemented using a series of inverter chain. That is, clock signal $\phi2$ is coupled to an inverter chain to generate clock signal $\phi\_delayed$. The inverter chain having a predetermined number of delay stages to provide the desired clock delay. In another embodiment, the delay circuit can be implemented as a RC time constant circuit where the charging and discharging of a capacitance is used to determine the delay time. Other delay circuits, known or to be developed, can be used to generate a delayed version of a clock signal. In accordance with another aspect of the present invention, the undelayed clock signal φ2 is applied to the bootstrapped switches directly and the undelayed clock signal is self-delayed by circuit elements in the bootstrapped switch circuit, as will be described in more detail below. In this manner, no additional clock signal delay circuitry is required.

Figure 3:
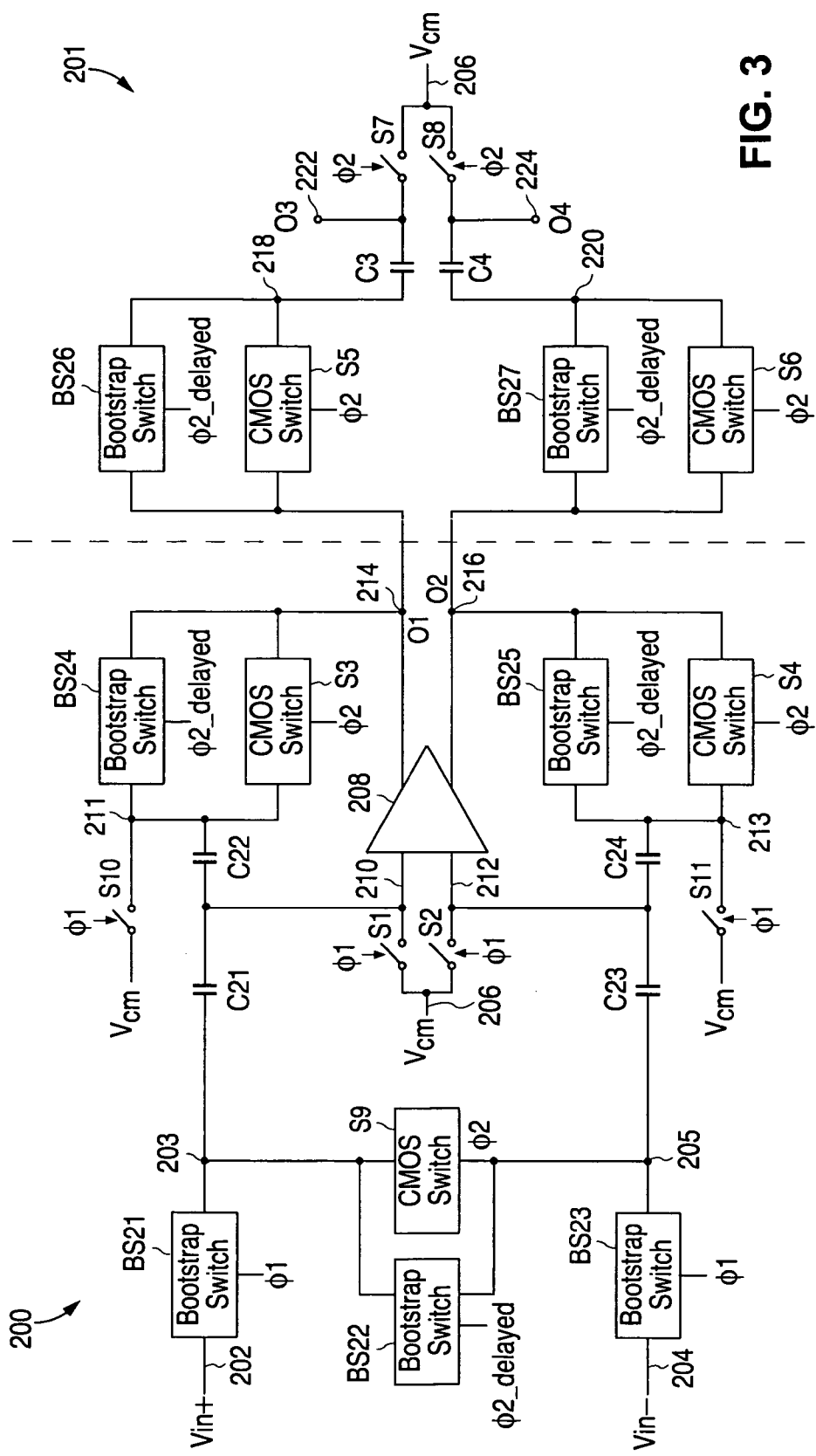
FIG. 3 is a circuit diagram of a charge-transfer type SHA employing a parallel connection of a bootstrapped switch and a non-boosted CMOS switch and operated under a time-shifted switching scheme according to one embodiment of the present invention.

FIG. 3 is a circuit diagram of a charge-transfer type SHA employing a parallel connection of a bootstrapped switch and a non-boosted CMOS switch and operated under a time-shifted switching scheme according to one embodiment of the present invention. The basic construction of SHA 200 in FIG. 3 as a charge-transfer type sample-and-hold amplifier is conventional and will not be further described in details. Only the application of the time-shifted switching scheme of the present invention to SHA 200 of FIG. 3 will be described in detail.

Referring to FIG. 3, SHA 200 includes a parallel connection of a bootstrapped switch and a non-boosted switch in the feedback signal path. Specifically, a bootstrapped switch BS24 and a non-boosted CMOS switch S3 are connected in parallel between first output terminal 214 of operational amplifier 208 and the bottom plate (node 211) of feedback capacitor C22 to form the first feedback signal path for the differential output signal 01. Feedback capacitor C22 connects the feedback switches (BS24 and S3) to a first input terminal (210) of operational amplifier 208. A bootstrapped switch BS25 and a non-boosted switch S4 are connected in parallel between second output terminal 216 of operational amplifier 208 and the bottom plate (node 213) of feedback capacitor C24 to form the second feedback signal path for the differential output signal O2. Feedback capacitor C24 connects the feedback switches (BS25 and S4) to a second input terminal (212) of operational amplifier 208.

In the first and second feedback signal paths, the non-boosted switches S3 and S4 are controlled by a clock signal φ2 while bootstrapped switches BS24 and BS25 are controlled by a clock signal φ2_delayed which is a delayed version of the clock signal φ2. Accordingly, whenever the clock signal φ2 enters its active phase, non-boosted switches S3 and S4 are turned on first to activate the feedback loop of SHA 200 and then bootstrapped switch BS24 and BS25 are subsequently turned on after the delay provided by clock signal φ2_delayed.

In SHA 200, the input nodes equalizing switch is also implemented as a parallel connection of a bootstrapped switch and a non-boosted switch. Specifically, a bootstrapped switch BS22 and a non-boosted switch S9 are connected in parallel between a node 203, being the top plate of sampling capacitor C21, and a node 205, being the top plate of sampling capacitor C23. Non-boosted switch S9 is controlled by clock signal φ2 while bootstrapped switch BS22 is controlled by clock signal φ2_delayed. In operation, during the input sampling stage defined by clock signal φ1, bootstrapped switches BS21 and BS23 are turned on to sample the differential input signals Vin+ and Vin−, on nodes 202 and 204 respectively, onto the top plates of sampling capacitors C21 and C23. Then during the amplification stage defined by clock signal φ2, bootstrapped switches BS21 and BS23 are open and non-boosted switch S9 and bootstrapped switch BS22 are turned on to short the top plates of sampling capacitors CS21 and CS23, thereby equalizing the voltages at nodes 203 and 205. More specifically, under the time-shifted switching scheme, non-boosted switch S9 is turned on first and then after the predetermined delay provided by clock signal φ2_delayed, bootstrapped switch BS22 is turned on.

In FIG. 3, a loading stage 201 is shown coupled to the output terminals 214 and 216 of SHA 200. In the present embodiment, the sampling switches in loading stage 201 are also implemented as parallel bootstrapped and non-boosted switches BS26/S5 and BS27/S6) operated under the time-shifted switching scheme. As discussed above with reference to FIG. 2, the use of parallel bootstrapped and non-boosted switches in the loading stage of the SHA provides added advantages in operation but is optional. A single bootstrapped switch or a single non-boosted switch can be used to implement each sampling switch.

Figure 4:
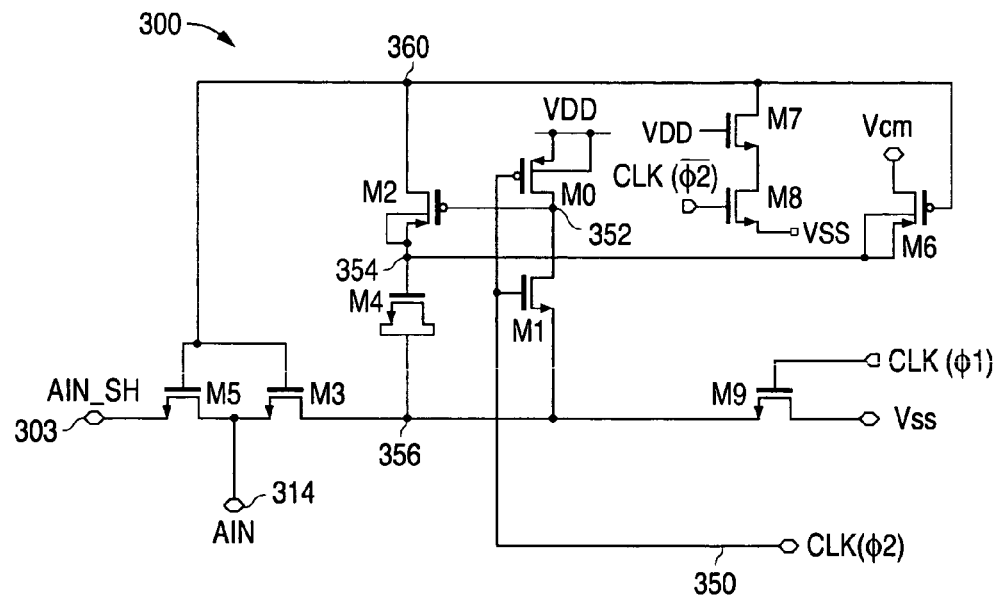
FIG. 4 is a circuit diagram of a bootstrapped switch circuit which can be used to implement the bootstrapped switches in the time-shifted switching scheme according to one embodiment of the present invention.

FIG. 4 is a circuit diagram of a bootstrapped switch circuit which can be used to implement the bootstrapped switches in the time-shifted switching scheme according to one embodiment of the present invention. Referring to FIG. 4, bootstrapped switch 300 includes a first input/output terminal 303 and a second input/output terminal 314. When implemented in SHA 100 of FIG. 2, the first and second input/output terminals 303, 314 are connected to respective output terminal (114 or 116) of operational amplifier 108 and respective sampling capacitor top plate (103 or 105). Bootstrapped switch 300 also includes a clock input terminal 350 receiving a clock input signal CLK which is the clock signal φ2 in the present illustration. In the present embodiment, bootstrapped switch 300 employs a self-delayed clocking scheme whereby the bootstrapped switch receives an undelayed clock signal and the intrinsic delay of the bootstrapped switch circuit is used to self-delay the clock signal in the bootstrapped switch circuit. Therefore, even though bootstrapped switch 300 receives the undelayed clock signal φ2, the operation of the bootstrapped switch 300 is actually in accordance with a delayed version of the clock signal φ2 to realize the time-shifted switching scheme.

Referring to FIG. 4, the main switching device in switch circuit 300 is NMOS transistor M5. Transistor M5 has a source terminal coupled to input/output terminal 303 and a drain terminal coupled to input/output terminal 31a. The control terminal (node 360) of transistor M5 is the delayed clock signal which is generated as follows.

The clock signal (undelayed) received on clock input terminal 350 is coupled to an inverter formed by PMOS transistor M0 and NMOS transistor M1. The output signal (node 352) of the inverter of transistors M0 and M1 is coupled to drive PMOS transistor M2. Transistor M2 is connected between the control terminal 360 of main switch M5 and a top plate (node 354) of a MOS capacitor M4. MOS capacitor M4 is precharged by a PMOS transistor M6 to the common mode voltage Vcm. The intrinsic delay through transistors M0, M1, M2 and M4 is relied upon to provide sufficient delay of the input clock signal CLK so that no additional delay circuitry is required to delay the input clock signal.

In operation, when the input clock signal CLK(φ2) is high, the inverter of PMOS transistor M0 and NMOS transistor M1 generates an inverted and delayed clock signal on node 352. The inverter output signal on node 352 therefore goes low. PMOS transistor M2 is enabled. Because MOS capacitor M4 was precharged to voltage Vcm or the positive power supply voltage Vdd, through PMOS transistor M6, NMOS transistor M3 is turned on when transistor M2 is turned on. As a result, the bottom plate of transistor M4 (node 356) is coupled through transistor M3 to the terminal 314 which can be the output terminal of the slewing operational amplifier. The gate voltage of NMOS transistor M5 (on node 360) is thereby boosted, allowing transistor M5 to operation with high linearity.

In switch circuit 300, NMOS transistors M7 and M8 operate to discharge the boosted gate voltage (node 360) of transistor M5. Transistor M7, driven by the Vdd voltage, is always on while transistor M8 is controlled by a clock signal CLK($\phi2\backslash$) to turn on when needed to discharge node 360 to the Vss voltage. Clock signal CLK($\phi2\backslash$) is the inverse of clock signal CLK($\phi2$). NMOS transistor M9, under the control of a signal CLK($\phi1$), operates to connect the bottom plate of MOS capacitor M4 to ground.

The above detailed descriptions are provided to illustrate specific embodiments of the present invention and are not intended to be limiting. Numerous modifications and variations within the scope of the present invention are possible. The present invention is defined by the appended claims.

I claim:

1. A switched-capacitor circuit for sampling a pair of differential input signals, the switched-capacitor circuit comprising a pair of sampling capacitors coupled to sample the differential input signals based on a first clock signal and transfer charge associated with the sampled differential input signals to respective first and second input terminals of an amplifier, the switched-capacitor circuit further comprising:
   a first bootstrapped switch and a first non-boosted switch connected in parallel between a first output terminal of the amplifier and a first feedback node of the switched-capacitor circuit to form a first feedback signal path, the first bootstrapped switch and the first non-boosted switch each has a first switch position being open and a second switch position being closed, the first non-boosted switch being controlled by a second clock signal and the first bootstrapped switch being controlled by a third clock signal, wherein the first and second clock signals are non-overlapping clock signals and the third clock signal is the second clock signal delayed by a predetermined amount, the second and third clock signals being partially overlapping clock signals; and
   a second bootstrapped switch and a second non-boosted switch connected in parallel between a second output terminal of the amplifier and a second feedback node of the switched-capacitor circuit to form a second feedback signal path, the second bootstrapped switch and the second non-boosted switch each has a first switch position being open and a second switch position being closed, the second non-boosted switch being controlled by the second clock signal and the second bootstrapped switch being controlled by the third clock signal.

2. The switched-capacitor circuit of claim 1, wherein the amplifier comprises an operational amplifier, the operational amplifier providing a first pair of differential output signals at the first and second output terminals.

3. The switched-capacitor circuit of claim 2, wherein the switched-capacitor circuit is configured as a flip-around type sample-and-hold amplifier, each of the sampling capacitors having a top plate coupled to sample a respective one of the differential input signals and a bottom plate coupled to a respective input terminal of the operation amplifier, the first and second feedback nodes being the top plates of the sampling capacitors.

4. The switched-capacitor circuit of claim 2, wherein the switched-capacitor circuit is configured as a charge-transfer type sample-and-hold amplifier, each of the sampling capacitors having a top plate coupled to sample a respective one of the differential input signals and a bottom plate coupled to a respective input terminal of the operational amplifier, the switch-capacitor circuit further comprising a pair of feedback capacitors having top plates coupled to respective input terminals of the operational amplifier and bottom plates being the respective first and second feedback nodes.

5. The switched-capacitor circuit of claim 1, wherein each of the first and second non-boosted switches comprises one of a PMOS transistor, an NMOS transistor and a CMOS transmission gate.

6. The switched-capacitor circuit of claim 1, wherein the third clock signal is the same as the second clock signal and each of the first and second bootstrapped switches comprises a clock input circuit operative to introduce a delay in the third clock signal to generate a delayed clock signal for turning on and off the bootstrapped switch.

7. The switched-capacitor circuit of claim 6, wherein the clock input circuit comprises an inverter.

8. The switched-capacitor circuit of claim 2, further comprising:
   a first loading capacitor and a second loading capacitor, the first loading capacitor having a top plate being switchably coupled to the first output terminal of the operational amplifier and the second loading capacitor having a top plate being switchably coupled to the second output terminal of the operational amplifier, the first and second loading capacitors having bottom plates providing a second pair of differential output signals.

9. The switched-capacitor circuit of claim 8, wherein the first and second loading capacitors are coupled to the respective first and second output terminals of the operational amplifier through a pair of bootstrapped switches controlled by the second clock signal.

10. The switched-capacitor circuit of claim 8, further comprising:
   a third bootstrapped switch and a third non-boosted switch connected in parallel between the first output terminal of the operational amplifier and the top plate of the first loading capacitor, the third non-boosted switch being controlled by the second clock signal and the third bootstrapped switch being controlled by the third clock signal; and
   a fourth bootstrapped switch and a fourth non-boosted switch connected in parallel between the second output terminal of the operational amplifier and the top plate of the second loading capacitor, the fourth non-boosted switch being controlled by the second clock signal and the fourth bootstrapped switch being controlled the third clock signal.

11. The switched-capacitor circuit of claim 10, wherein each of the third and fourth non-boosted switches comprises one of a PMOS transistor, an NMOS transistor and a CMOS transmission gate.

12. The switched-capacitor circuit of claim 4, further comprising:
   a fifth bootstrapped switch and a fifth non-boosted switch connected in parallel between the top plates of the pair of sampling capacitors, the fifth non-boosted switch being controlled by the second clock signal and the fifth bootstrapped switch being controlled by the third clock signal.

13. The switched-capacitor circuit of claim 1, wherein the second clock signal is coupled to an inverter chain to generate the third clock signal.

14. The switched-capacitor circuit of claim 1, wherein the second clock signal is coupled to a RC time constant circuit to generate the third clock signal.

* * * * *